(12) United States Patent
Houston et al.

(10) Patent No.: US 8,339,839 B2
(45) Date of Patent: Dec. 25, 2012

(54) SRAM CELL FOR SINGLE SIDED WRITE

(75) Inventors: Theodore W. Houston, Richardson, TX (US); Anand Seshadri, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/363,051

(22) Filed: Jan. 31, 2012

(65) Prior Publication Data

US 2012/0127783 A1    May 24, 2012

Related U.S. Application Data

(62) Division of application No. 12/782,927, filed on May 19, 2010.

(60) Provisional application No. 61/180,319, filed on May 21, 2009.

(51) Int. Cl.
*G11C 11/00* (2006.01)

(52) U.S. Cl. .................................. 365/154; 365/156

(58) Field of Classification Search .................. 365/154, 365/156
See application file for complete search history.

(56) References Cited

U.S. PATENT DOCUMENTS

| | | | | |
|---|---|---|---|---|
| 5,040,146 | A * | 8/1991 | Mattausch et al. | 365/154 |
| 7,123,504 | B2 * | 10/2006 | Yabe | 365/156 |
| 7,782,654 | B2 * | 8/2010 | Hayashi et al. | 365/154 |
| 8,159,863 | B2 | 4/2012 | Houston et al. | |
| 8,164,945 | B2 | 4/2012 | Houston | |
| 8,179,715 | B2 | 5/2012 | Houston | |
| 8,184,474 | B2 | 5/2012 | Seshadri et al. | |
| 8,203,867 | B2 | 6/2012 | Houston | |
| 2006/0227595 | A1 * | 10/2006 | Chuang et al. | 365/154 |
| 2007/0025169 | A1 * | 2/2007 | Houston | 365/206 |
| 2007/0035986 | A1 * | 2/2007 | Houston | 365/154 |
| 2007/0279966 | A1 * | 12/2007 | Houston | 365/154 |
| 2009/0173971 | A1 * | 7/2009 | Houston et al. | 257/204 |
| 2009/0175070 | A1 * | 7/2009 | Houston | 365/154 |

* cited by examiner

*Primary Examiner* — VanThu Nguyen
*Assistant Examiner* — Khamdan Alrobaie
(74) *Attorney, Agent, or Firm* — Rose Alyssa Keagy; Wade J. Brady, III; Frederick J. Telecky, Jr.

(57) ABSTRACT

A first integrated circuit containing a single sided write SRAM cell array, each SRAM cell having a bit passgate and an auxiliary bit-bar driver transistor. A process of operating the first integrated circuit including a single sided read operation in which source nodes of the auxiliary drivers in both addressed cells and half-addressed cells are floated. A second integrated circuit containing an SRAM cell array, in which each SRAM cell includes a bit-side write passgate, a bit-bar-side read passgate and a bit-bar auxiliary driver transistor. A process of operating the second integrated circuit including a single sided read operation in which source nodes of the auxiliary drivers in both addressed cells and half-addressed cells are biased to a low bias voltage.

10 Claims, 7 Drawing Sheets

US 8,339,839 B2

SRAM CELL FOR SINGLE SIDED WRITE

CROSS-REFERENCE TO RELATED APPLICATIONS

This application is a divisional of application Ser. No. 12/782,927, filed on May 19, 2010, which claims the benefit of U.S. Provisional Application No. 61/180,319 filed May 21, 2009, both of which are incorporated herein by reference.

Furthermore, this application is related to:

patent application Ser. No. 12/782,908, (filed May 19, 2010) entitled "8T SRAM Cell With Four Load Transistors,"

patent application Ser. No. 12/782,874, (filed May 19, 2010) entitled "6T SRAM Cell With Single Sided Write,"

patent application Ser. No. 12/782,894, (filed May 19, 2010) entitled "Asymmetric SRAM Cell With Split Transistors On The Strong Side,"

patent application Ser. No. 12/782,902, (filed May 19, 2010) entitled "8T SRAM Cell With Two Single-Sided Ports," and Patent application Ser. No. 12/782,941, (filed May 19, 2010) entitled "8T SRAM Cell With One Word Line."

With their mention in this section, these patent applications are not admitted to be prior art with respect to the present invention; patent application Ser. No. 13/363,051, (filed Jan. 31, 2012).

FIELD OF THE INVENTION

This invention relates to the field of integrated circuits. More particularly, this invention relates to static random access memories (SRAMs) in integrated circuits.

DETAILED DESCRIPTION

Figure 1:
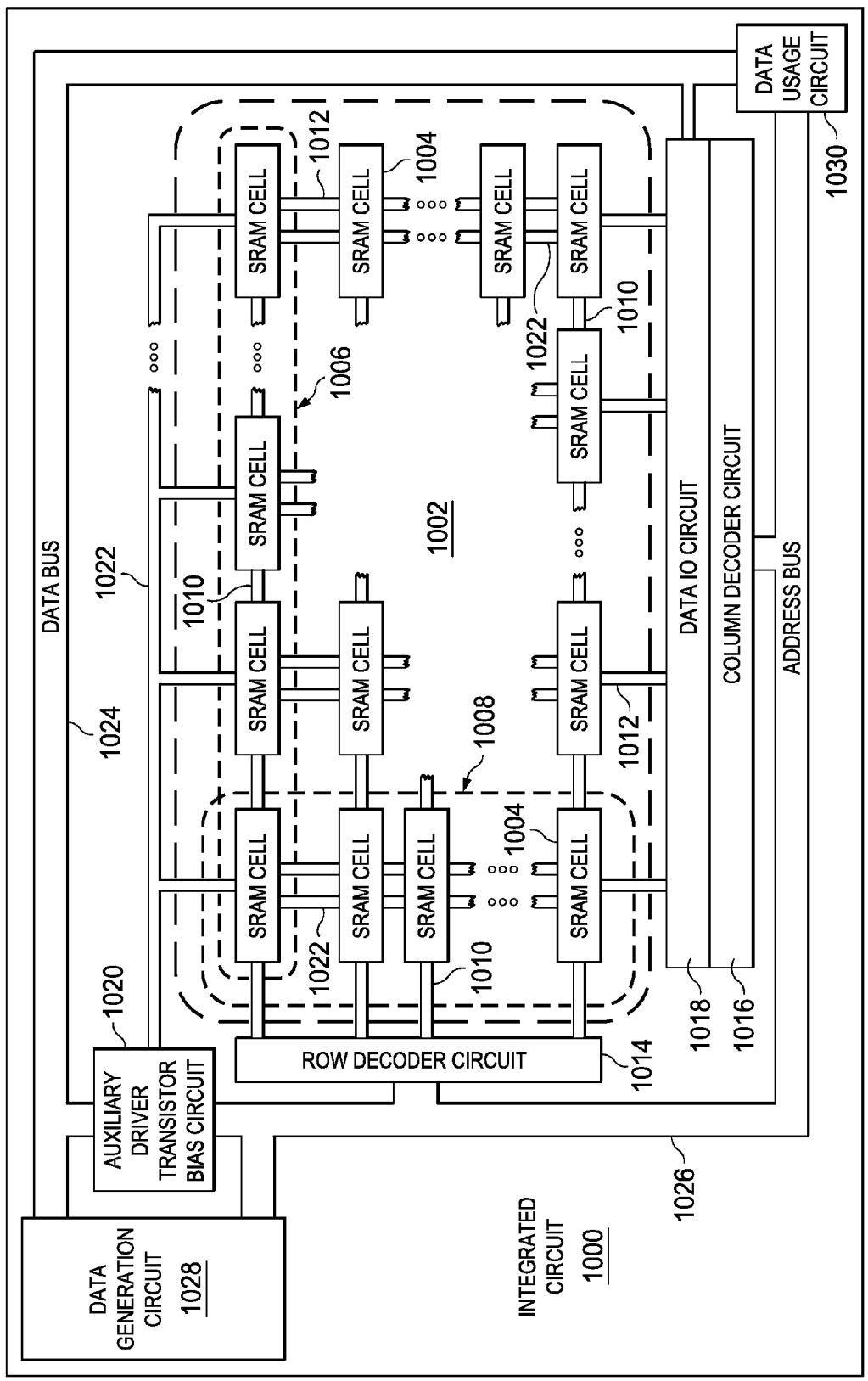
FIG. 1 depicts an integrated circuit containing an SRAM cell array which includes SRAM cells formed according to an embodiment.

Example embodiments described with reference to the attached figures, wherein like reference numerals are used throughout the figures to designate similar or equivalent elements. The figures are not drawn to scale and they are provided merely to illustrate the embodiments. It should be understood that numerous specific details, relationships, and methods are set forth to provide an understanding of the example embodiments. One skilled in the relevant art, however, will readily recognize that embodiments can be practiced without one or more of the specific details or with other methods. In other instances, well-known structures or operations are not shown in detail to avoid obscuring an embodiment. The example embodiments are not limited by the illustrated ordering of acts or events, as some acts may occur in different orders and/or concurrently with other acts or events. Furthermore, not all illustrated acts or events are required to implement a methodology in accordance with an embodiment.

For the purposes of this disclosure, the term "Vdd" is understood to refer to a power supply node with a potential suitable for source nodes of p-channel metal oxide semiconductor (PMOS) transistors. Similarly, the term "Vss" is understood to refer to a power supply node with a potential suitable for source nodes of n-channel metal oxide semiconductor (NMOS) transistors, and is lower than the Vdd potential. Connecting a node to Vss is commonly referred to as grounding the node. The term "low bias voltage" is understood to mean a bias voltage from Vss to midway between Vdd and Vss. The term "high bias voltage" is understood to mean a bias voltage from Vdd to midway between Vdd and Vss. The term "floated" is understood to mean disconnected from a voltage source such as Vdd or Vss, or connected to a voltage source through a high impedance, for example a transistor, a resistor or a diode, so as to limit charge accumulation on a floated node.

In this disclosure, the term "driver transistor" is understood to refer to a metal oxide semiconductor (MOS) transistor (possibly a finFET transistor or a carbon nanotube transistor (CNT)) in an SRAM cell. A drain node of the driver transistor is connected to a data node of the SRAM cell. A gate node of the driver transistor is connected to an opposite data node of the SRAM cell from the driver drain node. A source node of the driver transistor is connected to a power supply node (typically either Vdd for PMOS driver transistors or Vss for NMOS driver transistors). A polarity of the driver transistor source node power supply is opposite a polarity of a read operation pre-charge potential of a corresponding data line which is connected to the driver transistor through a passgate transistor. That is, SRAM cells in arrays which pre-charge data lines to a high voltage have NMOS driver transistors, while SRAM cells in arrays which pre-charge data lines to a low voltage have PMOS driver transistors.

Similarly, the term "load transistor" is understood to refer to another MOS transistor (possibly a finFET transistor or a CNT) in the SRAM cell. A drain node of the load transistor is connected to a data node of the SRAM cell. A gate node of the load transistor is connected to an opposite data node of the SRAM cell from the load drain node. A source node of the load transistor is connected to a power supply node (typically either Vdd for PMOS load transistors or Vss for NMOS load transistors). A polarity of the load transistor source node power supply is the same as the polarity of a read operation pre-charge potential of a corresponding data line which is connected to the driver transistor through a passgate transistor. That is, SRAM cells in arrays which pre-charge data lines to a potential above Vss have PMOS load transistors, while SRAM cells in arrays which pre-charge data lines to a potential below Vdd have NMOS load transistors.

The term "passgate transistor" is understood to refer to yet another MOS transistor (possibly a finFET transistor or a CNT) in the SRAM cell, of which one source/drain node is connected to a data node of the SRAM cell and an opposite source/drain node is connected to a corresponding data line of the SRAM cell. Similarly, the term "access transistor" is understood to refer to an MOS transistor in the SRAM cell, of which one source/drain node is connected to a data node of the SRAM cell and an opposite source/drain node is connected to a read buffer transistor. For the purposes of this disclosure, use of the term passgate transistor will be distinguished from use of the term access transistor by a convention in which passgate transistors are never connected to read buffer transistors while access transistors are always connected to read buffer transistors.

The term "word line" is understood to mean an interconnect element connected to gate nodes of passgate transistors and/or access transistors in a row of SRAM cells. The terms "bit line" and "bit-bar line" are understood to refer to data lines connected to passgate transistors or read buffers in a column of SRAM cells.

For the purposes of this disclosure, the term "bit-side" is understood to refer to components such as a driver transistor, load transistor and passgate transistor connected one data node in an SRAM cell, which is the bit-side data node, commonly referred to as the bit-side node. Similarly, the term "bit-bar-side" is understood to refer to components connected to a bit-bar-side data node (opposite from the bit-side node in the SRAM cell), commonly referred to as the bit-bar-side node. A bit-side data line is commonly referred to as a bit line. A bit-bar-side data line is commonly referred to as a bit-bar line. A bit-side driver transistor is commonly referred to as a bit driver; similarly a bit-bar-side driver transistor is commonly referred to as a bit-bar driver. A bit-side load transistor is commonly referred to as a bit load; similarly a bit-bar-side load transistor is commonly referred to as a bit-bar load. A bit-side passgate transistor is commonly referred to as a bit passgate; similarly a bit-bar-side passgate transistor is commonly referred to as a bit-bar passgate.

For the purposes of this disclosure, the term "addressed SRAM cell" is understood to refer to an SRAM cell in which a passgate transistor is turned on, and a bit line is connected to read circuitry or write circuitry. The term "half-addressed SRAM cell" is understood to refer to an SRAM cell in which a passgate transistor is turned on, while a bit line is disconnected from read or write circuitry.

In some instances of integrated circuits containing SRAM cell arrays, substantially all circuits in the integrated circuit are dedicated to operation of the SRAM array. In these instances, circuits which provide data to be stored in the SRAM array and circuits which use data from the SRAM array are located outside the integrated circuit containing the SRAM array. In other instances of integrated circuits containing SRAM cell arrays (such as microprocessors, digital signal processors and wireless telephony controllers), circuits which provide data to be stored in the SRAM array and circuits which use data from the SRAM array are located in the integrated circuit containing the SRAM array.

An integrated circuit may contain an SRAM array in which each SRAM cell is configured for single sided read and single sided write, and each SRAM cell includes an auxiliary driver transistor. A drain of the auxiliary driver is connected to the bit-bar-side node, and a gate of the auxiliary driver is connected to the bit-side node.

Single sided read is accomplished through a read passgate connected to the bit-side node. Single sided write may be accomplished through the read passgate in one realization of the SRAM cell or through a write passgate connected to the bit-bar-side node in another realization of the SRAM cell.

FIG. 1 depicts an integrated circuit (1000) containing an SRAM cell array (1002) which includes SRAM cells (1004) formed according to an embodiment. The SRAM cells (1004) are arranged in rows (1006) and columns (1008). Each word line (1010) is connected to SRAM cells (1004) in a row (1006). Each data line bus (1012) is connected to SRAM cells (1004) in a column (1008). Each data line bus (1012) may include one or more bit-side data lines or bit-bar-side data lines. A row decoder circuit (1014) applies appropriate biases to word lines (1010). A column decoder circuit (1016) applies appropriate biases to bit-side data lines or bit-bar-side data lines in the data line buses (1012). A data input/output (IO) circuit (1018) reads data from the data line buses (1012) during read operations and applies appropriate potentials to the data line buses (1012) during write operations. An auxiliary driver transistor bias circuit (1020) applies biases to an auxiliary driver bus (1022) which is connected to source nodes of auxiliary driver transistors in the SRAM cells (1004). The auxiliary driver transistor bias circuit (1020) may be capable of biasing the auxiliary driver transistors independently by column. The integrated circuit further includes a data bus (1024) which carries data bits between the SRAM cell array (1002) and other circuits in the integrated circuit (1000), and an address bus (1026) which is used to select SRAM cells (1004) in the SRAM cell array (1002) for read and write operations. The address bus (1026) is connected to the row decoder circuit (1014), the column decoder circuit (1016) and the auxiliary driver transistor bias circuit (1020). The integrated circuit (1000) may also contain a data generation circuit (1028) which connects to the data bus (1024) and address bus (1026). The data generation circuit (1028) produces incoming data bits for storage in the SRAM cell array (1002). The data bus (1024) carries the incoming data bits from the data generation circuit (1028) to the SRAM cell array (1002). The integrated circuit (1000) may also contain a data usage circuit (1030) which connects to the data bus (1024) and address bus (1026). The data usage circuit (1030) uses outgoing data bits which were stored in the SRAM cell array (1002). The data bus (1024) carries the outgoing data bits from the SRAM cell array (1002) to the data usage circuit (1030).

Figure 2:
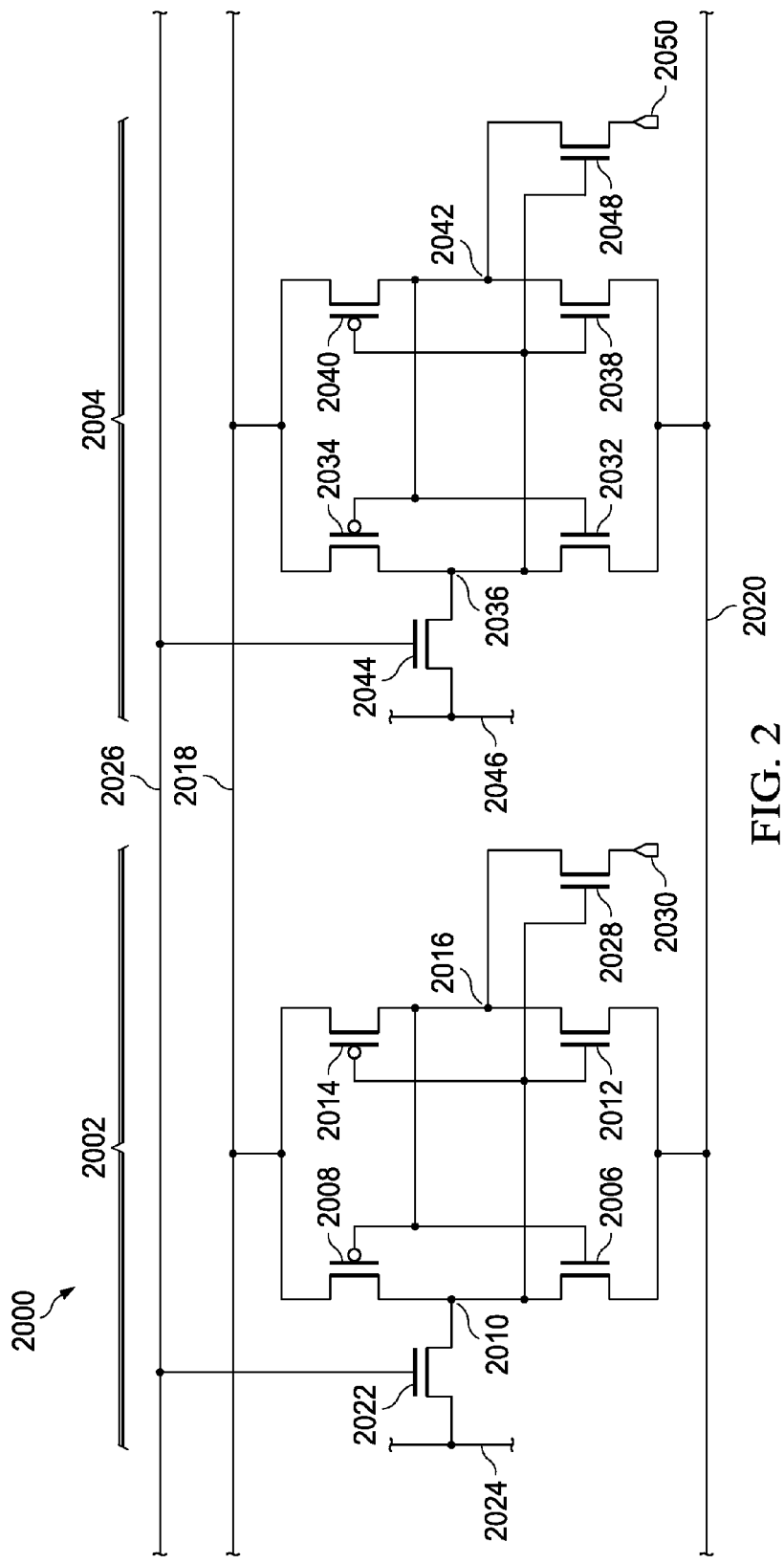
FIG. 2 is a circuit diagram of an SRAM cell array formed according to an embodiment in an integrated circuit.

FIG. 2 is a circuit diagram of an SRAM cell array (2000) formed according to a first embodiment in an integrated circuit. The SRAM cell array (2000) contains a first SRAM cell (2002) and a second SRAM cell (2004). The first SRAM cell (2002) includes an NMOS first bit-side driver transistor (2006) commonly known as a first bit driver (2006) and a PMOS first bit-side load transistor (2008) commonly known as a first bit load (2008). A drain node of the first bit driver (2006) and a drain node of the first bit load (2008) are connected to a first bit-side node (2010). The first SRAM cell (2002) also includes an NMOS first bit-bar-side driver transistor (2012) commonly known as a first bit-bar driver (2012) and a PMOS first bit-bar-side load transistor (2014) commonly known as a first bit-bar load (2014). A drain node of the first bit-bar driver (2012) and a drain node of the first bit-bar load (2014) are connected to a first bit-bar-side node (2016). A source node of the first bit load (2008) and a source node of the first bit-bar load (2014) are connected to an array power line (2018). A source node of the first bit driver (2006) and a source node of the first bit-bar driver (2012) are connected to an array ground line (2020). A gate node of the first bit driver (2006) and a gate node of the first bit load (2008) are connected to the first bit-bar-side node (2016). Similarly, a gate node of the first bit-bar driver (2012) and a gate node of the first bit-bar load (2014) are connected to the first bit-side node (2010). The first bit driver (2006) and the first bit load (2008), with connected gate nodes, form a first bit inverter. Similarly, the first bit-bar driver (2012) and the first bit-bar load (2014), with connected gate nodes, form a first bit-bar inverter. Configuring the gate node connections as described with respect to FIG. 2 provides a pair of cross-coupled inverters in the first SRAM cell (2002).

The first bit-side node (2010) is connected to a first bit-side passgate (2022). A first source/drain node of the first bit-side passgate (2022) is connected to the first bit-side node (2010). A second source/drain node of the first bit-side passgate (2022) is connected to a first bit line (2024). A gate node of the first bit-side passgate (2022) is connected to a word line (2026).

The first SRAM cell (2002) also includes an NMOS first bit-bar-side auxiliary driver transistor (2028). A drain node of the first bit-bar-side auxiliary driver transistor (2028) is connected to the first bit-bar-side node (2016). A gate node of the first bit-bar-side auxiliary driver transistor (2028) is connected to the first bit-side node (2010). A source node (2030) of the first bit-bar-side auxiliary driver transistor (2028) may be connected to other source nodes of other bit-bar-side auxiliary driver transistors in a same column as the first SRAM cell (2002).

In one realization of the instant embodiment, an average on-state current of the first bit driver (2006) may be greater than an average on-state current of the first bit-bar-side driver transistor (2012) and less than a sum of the average on-state current of the first bit-bar driver (2012) and the first bit-bar-side auxiliary driver transistor (2028). In a further realization, a threshold voltage of the first bit-bar-side auxiliary driver transistor (2028) may be less than a threshold voltage of the first bit driver transistor (2006).

The second SRAM cell (2004) includes a second bit driver (2032) and a second bit load (2034) connected at a second bit-side node (2036) as in the first SRAM cell (2002). Similarly, the second SRAM cell (2004) includes a second bit-bar driver (2038) and a second bit-bar load (2040) connected at a second bit-bar-side node (2042). Gate nodes of the second bit driver (2032) and second bit load (2034) are connected to the second bit-bar-side node (2042). Similarly, gate nodes of the second bit-bar driver (2038) and second bit-bar load (2040) are connected to the second bit-side node (2036). Source nodes of the second bit load (2034) and second bit-bar load (2040) are connected to the array power line (2018). Source nodes of the second bit driver (2032) and second bit-bar driver (2038) are connected to the array ground line (2020). Configuring the second bit driver (2032), the second bit load (2034), the second bit-bar driver (2038) and the second bit-bar load (2040) as described with respect to FIG. 2 provides a pair of cross-coupled inverters in the second SRAM cell (2004).

The second bit-side node (2036) is connected to a second bit-side passgate (2044). A first source/drain node of the second bit-side passgate (2044) is connected to the second bit-side node (2036). A second source/drain node of the second bit-side passgate (2044) is connected to a second bit line (2046). A gate node of the second bit-side passgate (2044) is connected to the word line (2026).

The second SRAM cell (2004) also includes an NMOS second bit-bar-side auxiliary driver transistor (2048). A drain node of the second bit-bar-side auxiliary driver transistor (2048) is connected to the second bit-bar-side node (2042). A gate node of the second bit-bar-side auxiliary driver transistor (2048) is connected to the second bit-side node (2036). A source node (2050) of the second bit-bar-side auxiliary driver transistor (2048) may be connected to other source nodes of other bit-bar-side auxiliary driver transistors in a same column as the second SRAM cell (2004). The transistors of the second SRAM cell (2004) are formed so as to have substantially identical properties as corresponding transistors of the first SRAM cell (2002).

During a single sided write operation, the first SRAM cell (2002) may be addressed and the second SRAM cell (2004) may be half-addressed. The single sided write operation is performed on the addressed SRAM cell (2002) by transferring a data potential from the first bit line (2024) through the first bit-side passgate (2022) to the first bit-side node (2010). In a single sided write low operation, a data potential substantially equal to Vss is transferred. In a single sided write high operation, a data potential substantially equal to Vdd is transferred. During a single sided read operation, the first SRAM cell (2002) may be addressed and the second SRAM cell (2004) may be half-addressed. The single sided read operation is performed on the addressed SRAM cell (2002) by transferring a data potential from the first bit-side node (2010) through the first bit-side passgate (2022) to the first bit line (2024). In the instant embodiment, the first bit-side passgate (2022) functions as a single sided write passgate and a single sided read passgate, the first bit line (2024) functions as a single sided write bit line and a single sided read bit line, and the word line (2026) functions as a write word line and a read word line.

In an alternate realization of the instant embodiment, one or more of the transistors of the first SRAM cell (2002) and second SRAM cell (2004) may be finFET transistors or CNTs. Forming the SRAM array (2000) with finFET transistors or CNTs may reduce a size of the SRAM array (2000) and possibly reduce manufacturing costs of an integrated circuit containing the SRAM array (2000).

Figure 3:
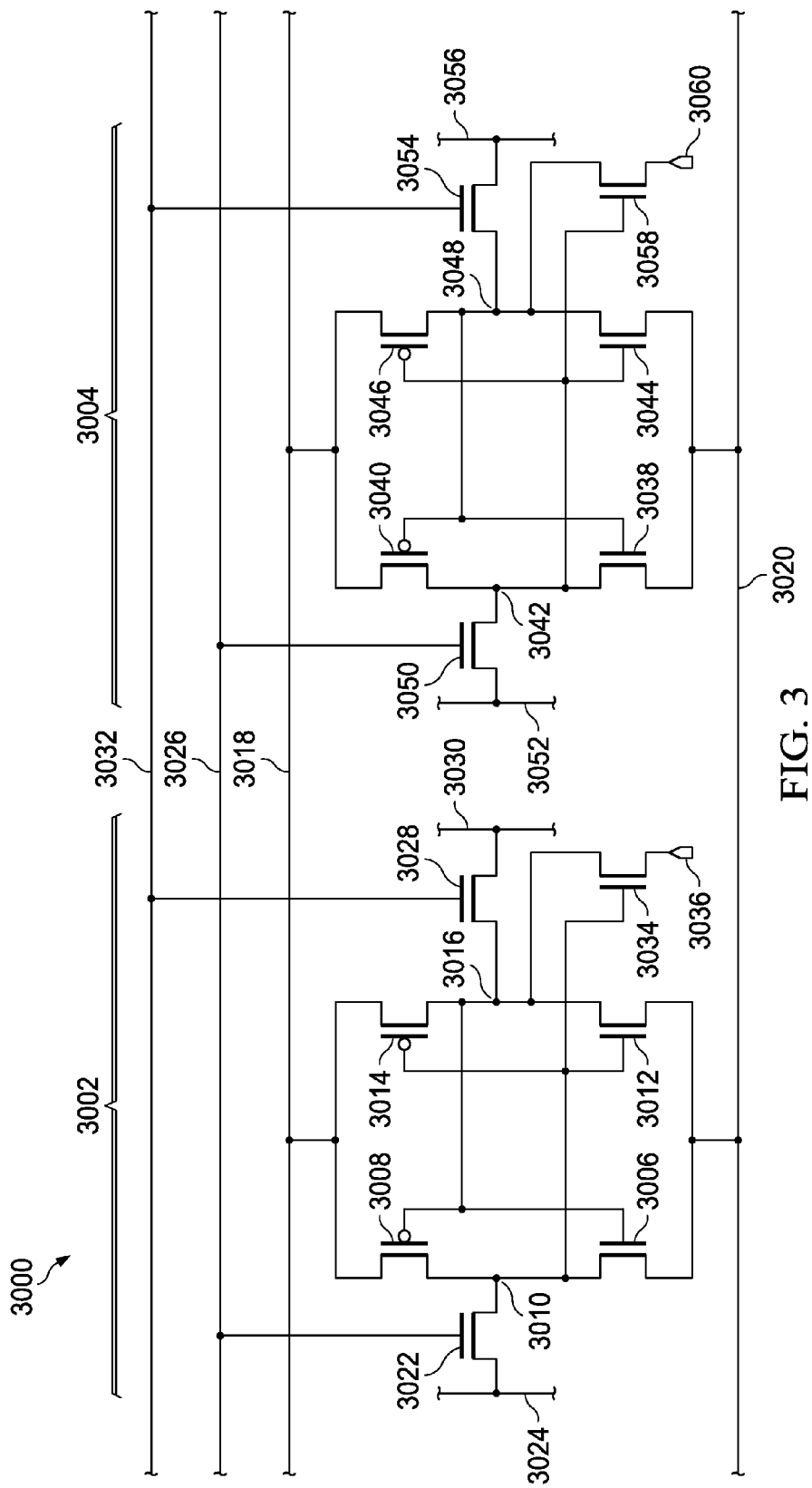
FIG. 3 is a circuit diagram of an SRAM cell array (3000) formed according to an embodiment in an integrated circuit.

FIG. 3 is a circuit diagram of an SRAM cell array (3000) formed according to a second embodiment in an integrated circuit. The SRAM cell array (3000) contains a first SRAM cell (3002) and a second SRAM cell (3004). The first SRAM cell (3002) includes an NMOS first bit driver (3006) and a PMOS first bit load (3008). A drain node of the first bit driver (3006) and a drain node of the first bit load (3008) are connected to a first bit-side node (3010). The first SRAM cell (3002) also includes an NMOS first bit-bar driver (3012) and a PMOS first bit-bar load (3014). A drain node of the first bit-bar driver (3012) and a drain node of the first bit-bar load (3014) are connected to a first bit-bar-side node (3016). A source node of the first bit load (3008) and a source node of the first bit-bar load (3014) are connected to an array power line (3018). A source node of the first bit driver (3006) and a source node of the first bit-bar driver (3012) are connected to an array ground line (3020). A gate node of the first bit driver (3006) and a gate node of the first bit load (3008) are connected to the first bit-bar-side node (3016). Similarly, a gate node of the first bit-bar driver (3012) and a gate node of the first bit-bar load (3014) are connected to the first bit-side node (3010). The first bit driver (3006) and the first bit load (3008), with connected gate nodes, form a first bit inverter. Similarly, the first bit-bar driver (3012) and the first bit-bar load (3014), with connected gate nodes, form a first bit-bar inverter. Configuring the gate node connections as described with respect to FIG. 3 provides a pair of cross-coupled inverters in the first SRAM cell (3002).

The first bit-side node (3010) is connected to a first write passgate (3022). A first source/drain node of the first write passgate (3022) is connected to the first bit-side node (3010). A second source/drain node of the first write passgate (3022)

is connected to a first write bit line (3024). A gate node of the first write passgate (3022) is connected to a write word line (3026).

The first bit-bar-side node (3016) is connected to a first read passgate (3028). A first source/drain node of the first read passgate (3028) is connected to the first bit-bar-side node (3016). A second source/drain node of the first read passgate (3028) is connected to a first read bit-bar line (3030). A gate node of the first read passgate (3028) is connected to a read word line (3032).

The first SRAM cell (3002) also includes an NMOS first bit-bar-side auxiliary driver transistor (3034). A drain node of the first bit-bar-side auxiliary driver transistor (3034) is connected to the first bit-bar-side node (3016). A gate node of the first bit-bar-side auxiliary driver transistor (3034) is connected to the first bit-side node (3010). A source node (3036) of the first bit-bar-side auxiliary driver transistor (3034) may be connected to other source nodes of other bit-bar-side auxiliary driver transistors in a same column as the first SRAM cell (3002).

In one realization of the instant embodiment, an average on-state current of the first bit driver (3006) may be greater than an average on-state current of the first bit-bar-side driver transistor (3012) and less than a sum of the average on-state current of the first bit-bar driver (3012) and the first bit-bar-side auxiliary driver transistor (3034). In a further realization, a threshold voltage of the first bit-bar-side auxiliary driver transistor (3034) may be less than a threshold voltage of the first bit driver transistor (3006).

The second SRAM cell (3004) includes a second bit driver (3038) and a second bit load (3040) connected at a second bit-side node (3042) as in the first SRAM cell (3002). Similarly, the second SRAM cell (3004) includes a second bit-bar driver (3044) and a second bit-bar load (3046) connected at a second bit-bar-side node (3048). Gate nodes of the second bit driver (3038) and second bit load (3040) are connected to the second bit-bar-side node (3048). Similarly, gate nodes of the second bit-bar driver (3044) and second bit-bar load (3046) are connected to the second bit-side node (3042). Source nodes of the second bit load (3040) and second bit-bar load (3046) are connected to the array power line (3018). Source nodes of the second bit driver (3038) and second bit-bar driver (3044) are connected to the array ground line (3020). Configuring the second bit driver (3038), the second bit load (3040), the second bit-bar driver (3044) and the second bit-bar load (3046) as described with respect to FIG. 3 provides a pair of cross-coupled inverters in the second SRAM cell (3004).

The second bit-side node (3042) is connected to a second write passgate (3050). A first source/drain node of the second write passgate (3050) is connected to the second bit-side node (3042). A second source/drain node of the second write passgate (3050) is connected to a second write bit line (3052). A gate node of the second write passgate (3050) is connected to the write word line (3026).

The second bit-bar-side node (3048) is connected to a second read passgate (3054). A first source/drain node of the second read passgate (3054) is connected to the second bit-bar-side node (3048). A second source/drain node of the second read passgate (3054) is connected to a second read bit-bar line (3056). A gate node of the second read passgate (3054) is connected to the read word line (3032).

The second SRAM cell (3004) also includes an NMOS second bit-bar-side auxiliary driver transistor (3058). A drain node of the second bit-bar-side auxiliary driver transistor (3058) is connected to the second bit-bar-side node (3048). A gate node of the second bit-bar-side auxiliary driver transistor (3058) is connected to the second bit-side node (3042). A source node (3060) of the second bit-bar-side auxiliary driver transistor (3058) may be connected to other source nodes of other bit-bar-side auxiliary driver transistors in a same column as the second SRAM cell (3004). The transistors of the second SRAM cell (3004) are formed so as to have substantially identical properties as corresponding transistors of the first SRAM cell (3002).

During a single sided write operation, the first SRAM cell (3002) may be addressed and the second SRAM cell (3004) may be half-addressed. The single sided write operation is performed on the addressed SRAM cell (3002) by transferring a data potential from the first write bit line (3024) through the first write passgate (3022) to the first bit-side node (3010). In a single sided write low operation, a data potential substantially equal to Vss is transferred. In a single sided write high operation, a data potential substantially equal to Vdd is transferred. During a single sided read operation, the first SRAM cell (3002) may be addressed and the second SRAM cell (3004) may be half-addressed. The single sided read operation is performed on the addressed SRAM cell (3002) by transferring a data potential from the first bit-bar-side node (3016) through the first read passgate (3028) to the first read bit-bar line (3030).

In an alternate realization of the instant embodiment, one or more of the transistors of the first SRAM cell (3002) and second SRAM cell (3004) may be finFET transistors or CNTs. Forming the SRAM array (3000) with finFET transistors or CNTs may reduce a size of the SRAM array (3000) and possibly reduce manufacturing costs of an integrated circuit containing the SRAM array (3000).

Figure 4A:
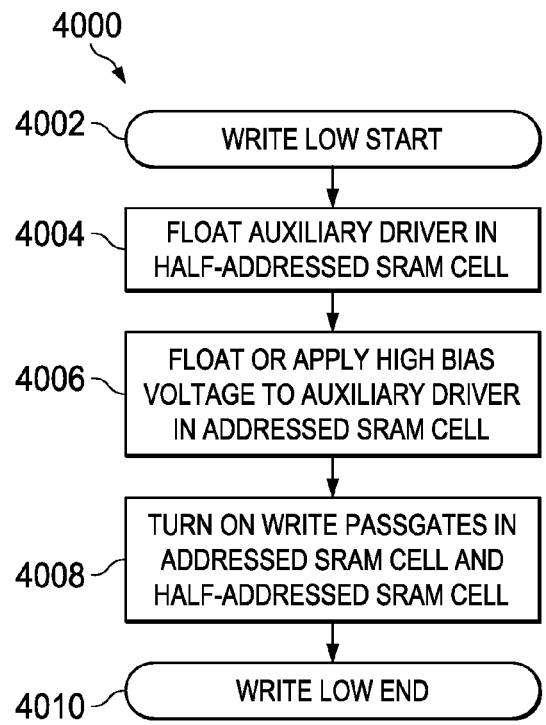
FIG. 4A and FIG. 4B are flowcharts of a single sided write low operation and a single sided write high operation, respectively.
Figure 4B:
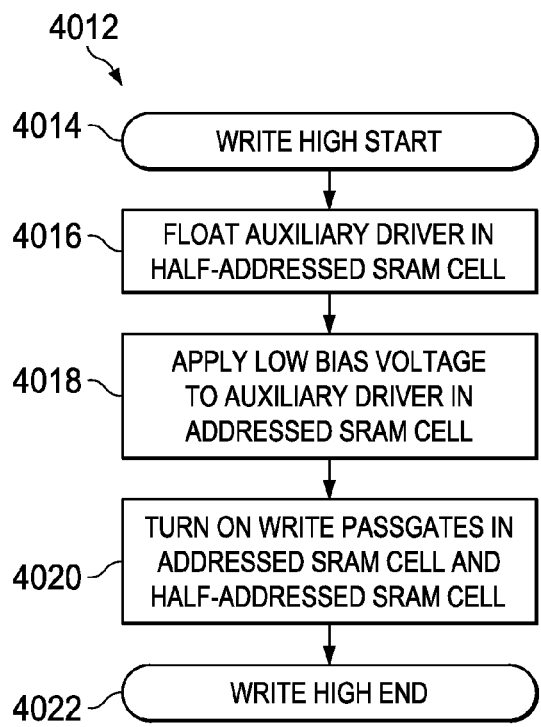

FIG. 4A and FIG. 4B are flowcharts of a single sided write low operation and a single sided write high operation, respectively. The single sided write low operation and the single sided write high operation may be performed on SRAM cell arrays as depicted in FIG. 2 and FIG. 3. Referring to FIG. 4A, the single sided write low operation (4000) begins (4002) with step (4004) which is to float the source node (2050, 3060) of the auxiliary driver transistor (2048, 3058) in the half-addressed SRAM cell (2004, 3004). Floating the source node (2050, 3060) during the single sided write low operation may provide increased data stability in the half-addressed SRAM cell (2004, 3004) by increasing an impedance between the bit-bar-side node (2042, 3048) and the array ground line (2020, 3020), compared to other embodiments of a single sided write low operation.

Step (4006) is to float or apply a high bias voltage to the source node (2030, 3036) of the auxiliary driver transistor (2028, 3034) in the addressed SRAM cell (2002, 3002). Floating the source node (2030, 3036) may increase a write low margin by increasing an impedance between the bit-bar-side node (2016, 3016) and the array ground line (2020, 3020). Biasing the source node (2030, 3036) to the high bias voltage may increase a write low margin by raising a potential on the bit-bar-side node (2016, 3016) from Vss.

In alternate realizations of the instant embodiment of the single sided write low operation, steps (4004) and (4006) may be executed concurrently or in any order. Subsequently, step (4008) is executed, which is to turn on the bit-side passgate or write passgate (2022, 3022) in the addressed SRAM cell and the write passgate (2044, 3050) in the half-addressed SRAM cell. A write boost potential or a delayed write boost potential may be applied to the word line or write word line (2026, 3026) which may increase a write low margin. The write boost potential and the delayed write boost potential are discussed in reference to FIG. 5. After step (4008) is executed, the single sided write low operation (4000) is ended (4010).

Referring to FIG. 4B, the single sided write high operation (4012) begins (4014) with step (4016) which is to float the source node (2050, 3060) of the auxiliary driver transistor (2048, 3058) in the half-addressed SRAM cell (2004, 3004). Floating the source node (2050, 3060) during the single sided write high operation may provide increased data stability in the half-addressed SRAM cell (2004, 3004) by increasing an impedance between the bit-bar-side node (2042, 3048) and the array ground line (2020, 3020), compared to other embodiments of a single sided write high operation.

Step (4018) is to bias the source node (2030, 3036) of the auxiliary driver transistor (2028, 3034) in the addressed SRAM cell (2002, 3002) to a low bias voltage. In one realization of the instant embodiment, the source node (2030, 3036) of the auxiliary driver transistor (2028, 3034) in the addressed SRAM cell (2002, 3002) may be biased from Vss to midway between Vdd and Vss. Biasing the source node (2030, 3036) to the low bias voltage may increase a write high margin by reducing an impedance between the bit-bar-side node (2016, 3016) and the array ground line (2020, 3020).

In alternate realizations of the instant embodiment of the single sided write high operation, steps (4016) and (4018) may be executed concurrently or in any order. Subsequently, step (4020) is executed, which is to turn on the bit-side passgate or write passgate (2022, 3022) in the addressed SRAM cell and the write passgate (2044, 3050) in the half-addressed SRAM cell. A write boost potential or a delayed write boost potential may be applied to the word line or write word line (2026, 3026) which may increase a write high margin. After step (4020) is executed, the single sided write high operation (4012) is ended (4022).

Figure 5A:
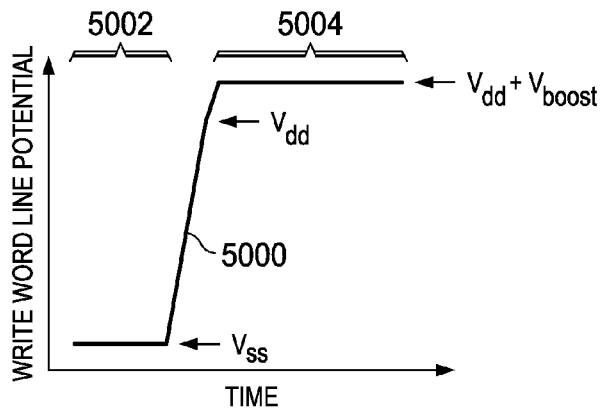
FIG. 5A and FIG. 5B are charts of write potentials applied to the write word line, which include a write boost voltage and a delayed write boost voltage, respectively.
Figure 5B:
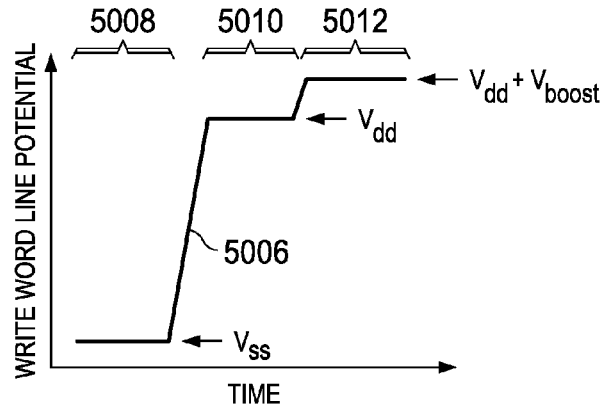

FIG. 5A and FIG. 5B are charts of write potentials applied to the write word line (2026, 3026) which include a write boost voltage and a delayed write boost voltage, respectively. The charts in FIG. 5A and FIG. 5B apply to SRAM cells as depicted in FIG. 2 and FIG. 3. Referring to FIG. 5A, the write word line potential (5000) starts (5002) at substantially Vss. A write potential including a write boost voltage is applied so as to raise the word line potential (5000) in a continuous manner to a boosted write potential (5004) substantially equal to Vdd+Vboost, where Vboost is the write boost voltage. In one realization of the instant embodiment, the write boost voltage may be between 100 and 400 millivolts. Performing a single sided write operation using a write potential which includes a write boost voltage as depicted in FIG. 5A may increase a write potential in the addressed SRAM cell (2002, 3002) by reducing an impedance between the first bit line or first write bit line (2024, 3024) and the first bit-side node (2010, 3010).

Referring to FIG. 5B, the write word line potential (5006) starts (5008) at substantially Vss. A write potential is applied so as to raise the word line potential (5006) in a continuous manner to an intermediate write potential (5010) substantially equal to Vdd. The word line potential (5006) is held at the intermediate write potential (5010) until transients in the half-addressed SRAM cell (2004, 3004) may have settled. In one realization of the instant embodiment, the word line potential (5006) may be held at the intermediate write potential (5010) between 0.5 and 2 nanoseconds. Subsequently, the word line potential (5006) is raised to a boosted write potential (5004) substantially equal to Vdd+Vboost. In one realization of the instant embodiment, Vboost may be between 100 and 400 millivolts. Performing a single sided write operation using a write potential that includes a delayed write boost voltage (as depicted in FIG. 5B) may provide increased stability in the half-addressed SRAM cell (2004, 3004) compared to embodiments using a non-delayed write boost voltage (while possibly providing an increased write potential in the addressed SRAM cell).

Figure 6:
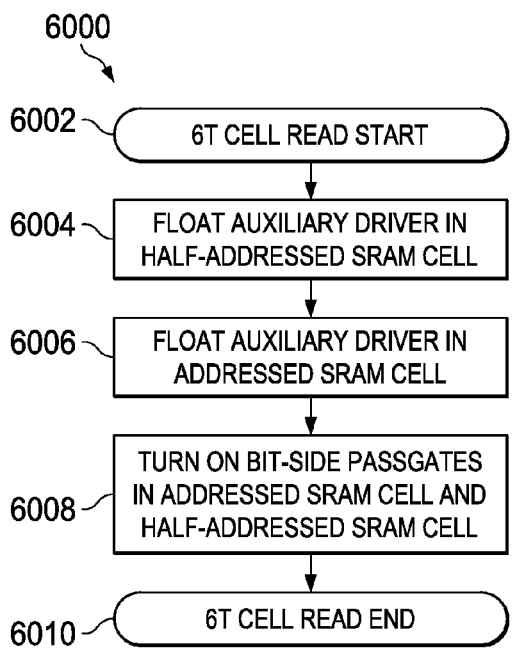
FIG. 6 is a flowchart of a single sided read operation performed on an SRAM cell array as depicted in FIG. 2.

FIG. 6 is a flowchart of a single sided read operation performed on an SRAM cell array as depicted in FIG. 2. The single sided read operation (6000) begins (6002) with step (6004) which is to float the source node (2050) of the auxiliary driver transistor (2048) in the half-addressed SRAM cell (2004). Floating the source node (2050) during the single sided read operation may provide increased data stability in the half-addressed SRAM cell (2004) by increasing an impedance between the bit-bar-side node (2042) in the half-addressed SRAM cell (2004) and the array ground line (2020), compared to other embodiments of a single sided read operation.

Step (6006) is to float the source node (2030) of the auxiliary driver transistor (2028) in the addressed SRAM cell (2002). Floating the source node (2030) may increase a read margin by increasing an impedance between the bit-bar-side node (2016) in the addressed SRAM cell (2002) and the array ground line (2020).

In alternate realizations of the instant embodiment of the single sided read operation (6000), steps (6004) and (6006) may be executed concurrently or in any order. Subsequently, step (6008) is executed, which is to turn on the first bit-side passgate (2022) in the addressed SRAM cell (2002) and the second bit-side passgate (2044) in the half-addressed SRAM cell. After step (6008) is executed, the single sided read operation (6000) is ended (6010).

Figure 7:
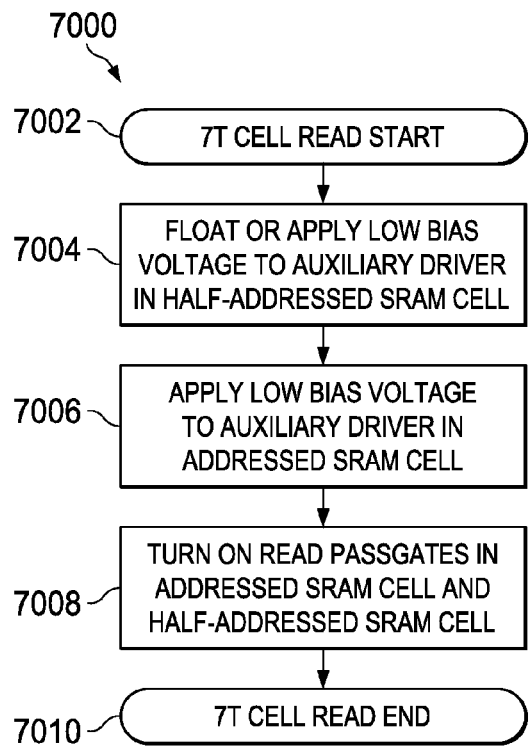
FIG. 7 is a flowchart of a single sided read operation performed on an SRAM cell array as depicted in FIG. 3.

FIG. 7 is a flowchart of a single sided read operation performed on an SRAM cell array as depicted in FIG. 3. The single sided read operation (7000) begins (7002) with step (7004) which is to float or apply a low bias voltage to the source node (3060) of the auxiliary driver transistor (3058) in the half-addressed SRAM cell (3004). Floating the source node (3060) during the single sided read operation may provide lower power consumption in the half-addressed SRAM cell (3004). Applying the low bias voltage to the source node (3060) during the single sided read operation may provide increased data stability in the half-addressed SRAM cell (3004) by reducing an impedance between the bit-bar-side node (3048) in the half-addressed SRAM cell (3004) and the array ground line (3020), compared to other embodiments of a single sided read operation. In one realization of the instant embodiment, the source node (3060) may be biased from Vss to midway between Vdd and Vss.

Step (7006) is to bias the source node (3036) of the auxiliary driver transistor (3034) in the addressed SRAM cell (3002) to a low bias voltage. Biasing the source node (3036) to a low bias voltage may increase a read margin by decreasing an impedance between the bit-bar-side node (3016) in the addressed SRAM cell (3002) and the array ground line (3020). In one realization of the instant embodiment, the source node (3036) may be biased from Vss to midway between Vdd and Vss.

In alternate realizations of the instant embodiment of the single sided read operation (7000), steps (7004) and (7006) may be executed concurrently or in any order. Subsequently, step (7008) is executed, which is to turn on the read passgate (3028) in the addressed SRAM cell (3002) and the read passgate (3054) in the half-addressed SRAM cell. After step (7008) is executed, the single sided read operation (7000) is ended (7010).

Figure 8:
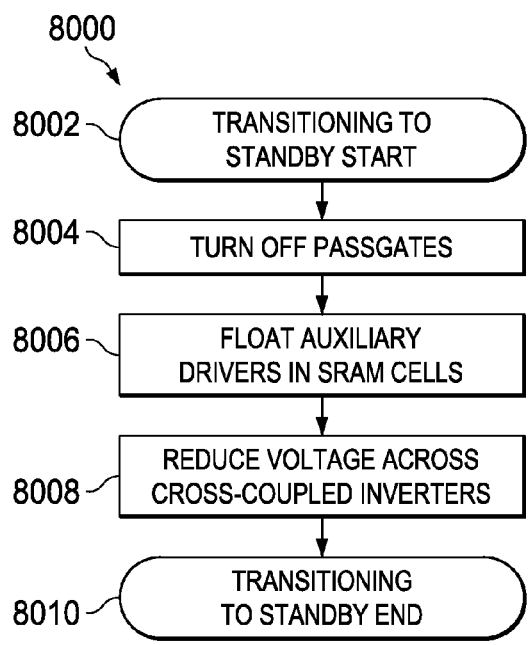
FIG. 8 is a flowchart of a transition to standby operation.

FIG. 8 is a flowchart of transitioning to standby operation. The transitioning to standby operation may be performed on SRAM cell arrays as depicted in FIG. 2 and FIG. 3. The transitioning to standby operation (8000) begins (8002) with step (8004) which is to turn off the passgate transistors (2022, 2044, 3022, 3028, 3050, 3054) in each SRAM cell (2002, 2004, 3002, 3004).

Subsequently, step (8006) is executed, which is to float the source nodes (2030, 2050, 3036, 3060) of the auxiliary driver transistors (2028, 2048, 3034, 3058) in each SRAM cell (2002, 2004, 3002, 3004). Floating the source nodes (2030, 2050, 3036, 3060) may reduce the power consumption of the SRAM cells (2002, 2004, 3002, 3004) during a standby mode compared to other realizations of standby modes in which the source nodes (2030, 2050, 3036, 3060) are biased.

Step (8008) is to reduce a voltage difference across the cross-coupled inverters in each SRAM cell (2002, 2004, 3002, 3004). The voltage difference may be reduced by reducing a voltage level on the array power line (2018, 3018) or by increasing a voltage level on the array ground line (2020, 3020). After step (8008) is executed, the transitioning to standby operation (8000) is ended (8010).

Figure 9:
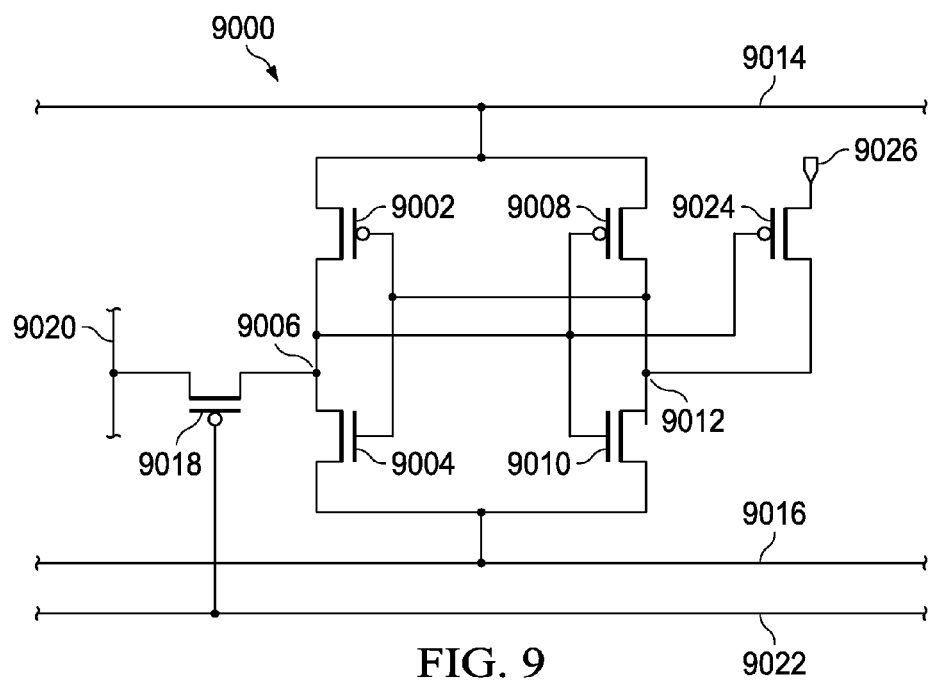
FIG. 9 is a circuit diagram of an SRAM cell including PMOS drivers, a PMOS auxiliary driver transistor and a single passgate functioning as a write passgate and a read passgate, formed according to an embodiment.

FIG. 9 is a circuit diagram of an SRAM cell including PMOS drivers, a PMOS auxiliary driver transistor and a single passgate functioning as a write passgate and a read passgate, formed according to an embodiment. The SRAM cell (9000) includes a PMOS bit driver (9002) and an NMOS bit load (9004) connected at a bit-side node (9006), and a PMOS bit-bar driver (9008) and an NMOS bit-bar load (9010) connected at a bit-bar-side node (9012), configured as a pair of cross-coupled inverters. A source node of the bit driver (9002) and a source node of the bit-bar driver (9008) are connected to an array power line (9014). A source node of the bit load (9004) and a source node of the bit-bar load (9010) are connected to an array ground line (9016).

A first source/drain node of a bit-side passgate (9018) is connected to the bit-side node (9006). A second source/drain node of the bit-side passgate (9018) is connected to a bit line (9020). A gate node of the bit-side passgate (9018) is connected to a word line (9022).

A drain node of a PMOS bit-bar-side auxiliary driver transistor (9024) is connected to the bit-bar-side node (9012). A gate node of the bit-bar-side auxiliary driver transistor (9024) is connected to the bit-side node (9006). A source node (9026) of the bit-bar-side auxiliary driver transistor (9024) may be connected to other source nodes of other bit-bar-side auxiliary driver transistors in a same column as the SRAM cell (9000).

In one realization of the instant embodiment, an average on-state current of the bit driver (9002) may be greater than an average on-state current of the bit-bar driver (9008) and less than a sum of the average on-state current of the bit-bar driver (9008) and the bit-bar-side auxiliary driver transistor (9024). In a further realization, a threshold voltage magnitude of the bit-bar-side auxiliary driver transistor (9024) may be less than a threshold voltage magnitude of the bit driver transistor (9002).

A single sided write operation is performed on the SRAM cell (9000) by transferring a data potential from the bit line (9020) through the bit-side passgate (9018) to the bit-side node (9006). In a single sided write low operation, a data potential substantially equal to Vss is transferred. In a single sided write high operation, a data potential substantially equal to Vdd is transferred. A single sided read operation is performed on the SRAM cell (9000) by transferring a data potential from the bit-side node (9006) through the bit-side passgate (9018) to the bit line (9020). In the instant embodiment, the bit-side passgate (9018) functions as a single sided write passgate and a single sided read passgate, the bit line (9020) functions as a single sided write bit line and a single sided read bit line, and the word line (9022) functions as a write word line and a read word line.

In an alternate realization of the instant embodiment, one or more of the transistors of the SRAM cell (9000) may be finFET transistors or CNTs. Forming the SRAM cell (9000) with finFET transistors or CNTs may reduce a size of the SRAM cell (9000) and possibly reduce manufacturing costs of an integrated circuit containing the SRAM cell (9000).

Figure 10:
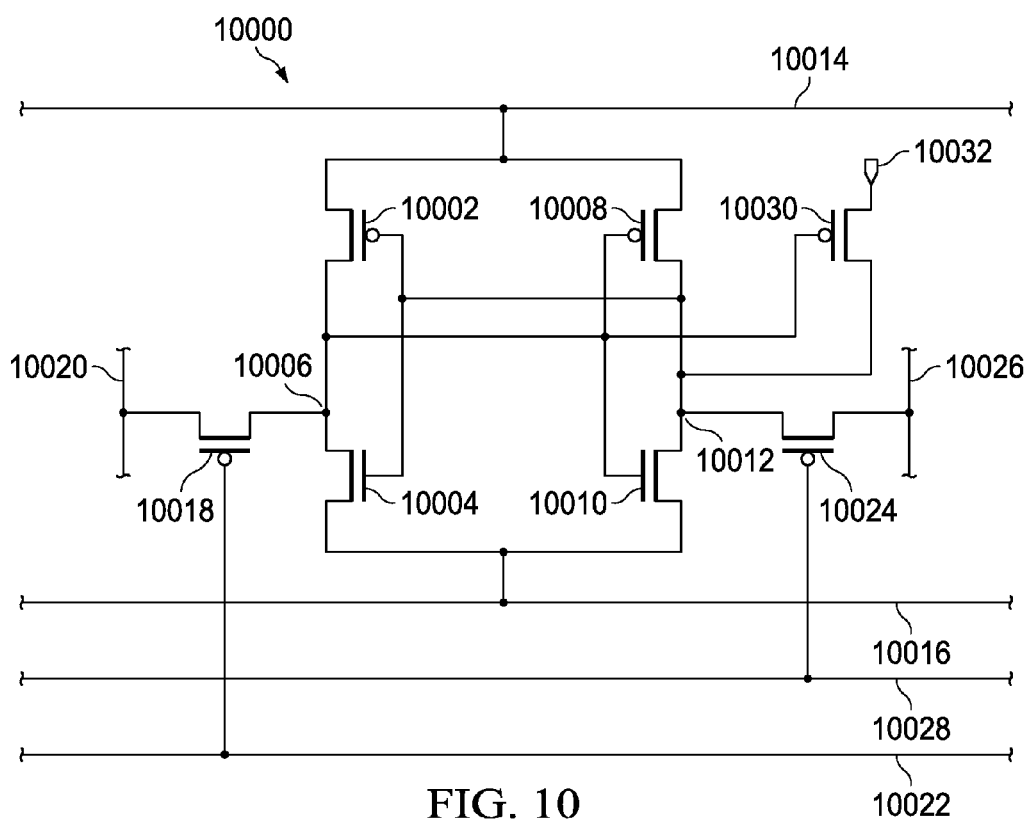
FIG. 10 is a circuit diagram of an SRAM cell including PMOS drivers, a PMOS bit-bar-side auxiliary driver transistor, a bit-side write passgate and a bit-bar-side read passgate, formed according to an embodiment.

FIG. 10 is a circuit diagram of an SRAM cell including PMOS drivers, a PMOS bit-bar-side auxiliary driver transistor, a bit-side write passgate and a bit-bar-side read passgate, formed according to an embodiment. The SRAM cell (10000) includes a PMOS bit driver (10002) and an NMOS bit load (10004) connected at a bit-side node (10006), and a PMOS bit-bar driver (10008) and an NMOS bit-bar load (10010) connected at a bit-bar-side node (10012), configured as a pair of cross-coupled inverters. A source node of the bit driver (10002) and a source node of the bit-bar driver (10008) are connected to an array power line (10014). A source node of the bit load (10004) and a source node of the bit-bar load (10010) are connected to an array ground line (10016).

A first source/drain node of a write passgate (10018) is connected to the bit-side node (10006). A second source/drain node of the write passgate (10018) is connected to a write bit line (10020). A gate node of the write passgate (10018) is connected to a write word line (10022).

A first source/drain node of a read passgate (10024) is connected to the bit-bar-side node (10012). A second source/drain node of the read passgate (10024) is connected to a read bit line (10026). A gate node of the read passgate (10024) is connected to a read word line (10028).

A drain node of a PMOS bit-bar-side auxiliary driver transistor (10030) is connected to the bit-bar-side node (10012). A gate node of the bit-bar-side auxiliary driver transistor (10030) is connected to the bit-side node (10006). A source node (10032) of the bit-bar-side auxiliary driver transistor (10030) may be connected to other source nodes of other bit-bar-side auxiliary driver transistors in a same column as the SRAM cell (10000).

A single sided write operation is performed on the SRAM cell (10000) by transferring a data potential from the write bit line (10020) through the write passgate (10018) to the bit-side node (10006). In a single sided write low operation, a data potential substantially equal to Vss is transferred. In a single sided write high operation, a data potential substantially equal to Vdd is transferred. A single sided read operation is performed on the SRAM cell (10000) by transferring a data potential from the bit-bar-side node (10012) through the read passgate (10024) to the read bit line (10026).

In an alternate realization of the instant embodiment, one or more of the transistors of the SRAM cell (10000) may be finFET transistors or CNTs. Forming the SRAM cell (10000) with finFET transistors or CNTs may reduce a size of the SRAM cell (10000) and possibly reduce manufacturing costs of an integrated circuit containing the SRAM cell (10000).

It will be recognized that the single sided write low operation discussed in reference to FIG. 4A and the single sided write high operation discussed in reference to FIG. 4B may be applied to the SRAM cells discussed in reference to FIG. 9 and FIG. 10, with appropriate changes in bias polarity. In addition, it will be recognized that the procedure of applying a write boost voltage or a delayed write boost voltage to a word line during a single sided write operation as described in reference to FIG. 5A and FIG. 5B may be applied to the SRAM cells discussed in reference to FIG. 9 and FIG. 10, with appropriate changes in bias polarity. Furthermore, it will be recognized that the single sided read operation discussed in reference to FIG. 6 may be applied to the SRAM cell discussed in reference to FIG. 9. Similarly, it will be recognized that the single sided read operation discussed in reference to FIG. 7 may be applied to the SRAM cell discussed in reference to FIG. 10, with appropriate changes in bias polarity. Moreover, it will be recognized that the transition to standby operation discussed in reference to FIG. 8 may be applied to the SRAM cells discussed in reference to FIG. 9 and FIG. 10.

While various embodiments of the present invention have been described above, it should be understood that they have been presented by way of example only and not limitation. Numerous changes to the disclosed embodiments can be made in accordance with the disclosure herein without departing from the spirit or scope of the embodiment. Thus, the breadth and scope of the embodiments should not be limited by the above description of the embodiments. Rather, the scope of the embodiments should be defined in accordance with the following claims and their equivalents.

What is claimed is:

1. An integrated circuit, comprising:
   an array of SRAM cells configured in rows and columns, each said SRAM cell including:
      a bit driver, said bit driver including a drain node, a source node, and a gate node;
      a bit-side node connected to said drain node of said bit driver;
      a bit load, said bit load including a drain node connected to said bit-side node, a source node, and a gate node;
      a bit-bar driver, said bit-bar driver including a drain node, a source node, and a gate node connected to said bit-side node;
      a bit-bar side node connected to said drain node of said bit-bar driver, to said gate node of said bit driver and to said gate node of said bit load;
      a bit-bar load, said bit-bar load including a drain node connected to said bit-bar side node, a source node, and a gate node connected to said bit-side node;
      a write passgate, said write passgate including a first source/drain node connected to said bit-side node, a second source/drain node connected to a write bit line, and a gate node connected to a write word line;
      a read passgate, said read passgate including a first source/drain node connected to said bit-bar-side node, a second source/drain node connected to a read bit-bar line, and a gate node connected to a read word line;
   and a bit-bar-side auxiliary driver transistor, said bit-bar-side auxiliary driver transistor including a drain node directly connected to said bit-bar side node, a source node, and a gate node connected to said bit-side node; and
   an auxiliary driver transistor bias circuit coupled to said source node of said bit-bar-side auxiliary driver transistor in said each said SRAM cells, such that said auxiliary driver transistor bias circuit is capable of biasing said source nodes of said bit-bar-side auxiliary driver transistors in said array of SRAM cells.

2. The integrated circuit of claim 1, in which said auxiliary driver transistor bias circuit is capable of biasing said source nodes of said bit-bar-side auxiliary driver transistors in addressed SRAM cells of said array of SRAM cells independently of said source nodes of said bit-bar-side auxiliary driver transistors in half-addressed SRAM cells of said array of SRAM cells.

3. The integrated circuit of claim 1, in which a boost voltage is provided during a single sided write high operation on said write word line between 100 and 400 millivolts above a bias voltage on said source nodes of said bit loads and said bit-bar loads.

4. The integrated circuit of claim 1, in which an intermediate write potential is provided during a single sided write high operation on said write word line that is substantially equal to a bias voltage on said source nodes of said bit loads and said bit-bar loads for between 0.5 and 2 nanoseconds, followed by a boost voltage on said write word line between 100 and 400 millivolts above said bias voltage on said source nodes of said bit loads and said bit-bar loads.

5. A process of operating an integrated circuit, comprising:
   performing a single sided read operation on an addressed SRAM cell in an SRAM cell array, by a process including:
      biasing a source node of a bit-bar-side auxiliary driver transistor of said addressed SRAM cell to a low bias voltage; and
      subsequently turning on a bit-side passgate of said addressed SRAM cell and turning on a bit-side passgate of a half-addressed SRAM cell;
   performing a single side write low operation on said addressed SRAM cell by a process including floating said source node of said bit-bar-side auxiliary driver transistor of said half addressed SRAM cell, said bit-bar-side auxiliary driver transistor having a drain node directly connected to a bit-bar side node; and
   performing a single sided write high operation on said addressed SRAM cell by a process including floating said source node of said bit-bar-side auxiliary driver transistor of said half-addressed SRAM cell.

6. The process of claim 5, in which said single sided write high operation includes:
   biasing said source node of said bit-bar-side auxiliary driver transistor of said addressed SRAM cell to a low bias voltage; and
   turning on said write passgate of said addressed SRAM cell.

7. The process of claim 5, in which said single sided write low operation includes:
   floating said source node of said bit-bar-side auxiliary driver transistor of said addressed SRAM cell; and
   turning on said write passgate of said addressed SRAM cell.

8. The process of claim 5, in which said single sided write low operation includes:
   biasing said source node of said bit-bar-side auxiliary driver transistor of said addressed SRAM cell to a high bias voltage; and
   turning on said write passgate of said addressed SRAM cell.

9. The process of claim 5, in which said single sided write high operation includes providing a boost voltage on said write word line between 100 and 400 millivolts above a bias voltage on source nodes of a bit loads and a bit-bar loads of said addressed SRAM cell.

10. The process of claim 5, in which said single sided write high operation includes steps:
    biasing said write word line to a potential that is substantially equal to a bias voltage on source nodes of a bit loads and a bit-bar loads of said addressed SRAM cell for a time that is between 0.5 and 2 nanoseconds; and
    providing a boost voltage on said write word line that is between 100 and 400 millivolts above a bias voltage on said source nodes of said bit load and said bit-bar load.

* * * * *